United States Patent [19]
Gregg et al.

[11] 4,037,093
[45] July 19, 1977

[54] MATRIX MULTIPLIER IN GF($2^m$)

[75] Inventors: Gordon E. Gregg, Tempe; Thomas H. Howell; Leonard Rabins, both of Scottsdale, all of Ariz.

[73] Assignee: Honeywell Information Systems, Inc., Phoenix, Ariz.

[21] Appl. No.: 644,776

[22] Filed: Dec. 29, 1975

[51] Int. Cl.² .............................................. G06F 7/52
[52] U.S. Cl. ................................................... 235/164
[58] Field of Search ............... 235/164, 156, 159, 160, 235/152

[56] References Cited

U.S. PATENT DOCUMENTS 3,557,356  1/1971  Balza et al. ........................... 235/152

OTHER PUBLICATIONS

B. A. Laws, Jr. et al, "A Cellular-Array Multiplier for GF($2^m$)" *IEEE Trans. on Computers*, Dec. 1971, pp. 1573-1578.

*Primary Examiner*—David H. Malzahn
*Attorney, Agent, or Firm*—William W. Holloway, Jr.; Ronald T. Reiling; Nicholas Prasinos

[57] ABSTRACT

The invention comprises circuitry for systematically multiplying two arbitrary field elements in a Galois field GF($2^m$). Each element is represented by an m-bit binary number. The multiplicand field element is passed serially through a plurality of m-1 modulo multipliers. The multiplicand and the product from each of the m-1 modulo multipliers are passed through networks which are gated by bits of the multiplier field element forming partial products. The partial products are summed to form the bit representations of the final product.

5 Claims, 3 Drawing Figures

MATRIX MULTIPLIER IN GF($2^m$)

RELATED APPLICATIONS

U.S. application Ser. No. 645,056, entitled "Table Lookup Direct Decoder for Double-Error Correcting (DEC) BCH Codes Using General Pair of Syndromes" invented by the same inventors and assigned to the same assignee as named herein, and filed on the same date is incorporated by reference herein.

DESCRIPTION OF THE PRIOR ART

1. Field of the Invention

The invention relates to circuitry for binary multiplication of field elements in a Galois field and of ordered matrices constructed from elements in a Galois field.

2. Background

Computer science is an emerging discipline which has greatly and significantly impacted modern technology. Electronic data processing systems now impact such diverse fields as science, engineering, banking, business, manufacturing and innumerable others. These systems are mostly based on digital electronics. Theories of computer science often form the basis for implementing the electronic data processing systems.

One such field within computer science includes ring and field theory. These mathematical principles are applied to coding theory for use in computing systems. One especially useful type theory involves Galois fields. Galois field theory is useful in deriving coding schemes, for example, for error detection and correction (EDAC) systems. Multiplication algorithms used in coding are formulated using Galois field theory, enabling highspeed, low-cost multiplier implementations. The related application cited above is an example of a complex EDAC system based on Galois field theory. Its implementation utilizes circuitry for multiplying arbitrary field elements in a Galois field GF($2^m$).

Previous implementations of such multipliers, often called matrix multipliers, were based on specialized equations for a specific Galois field. They became particularly complex and burdensome in large fields. See, for example, T. C. Bartee and D. I. Schneider, "Computation with Finite Fields," Information and Control 61,79-98 (1963). There are no previously known systematic combinational logic implementations whose design can be implemented in simple large-scale integrated (LSI) circuitry.

A portion of the present invention is somewhat analogous to a shift register. Each iterative multiplication substep is equivalent to a shift of the shift register. Division similarly entails iterative division substeps. A systematic approach to dividing a field element of a Galois field by the generator polynomial of the Galois field is presented by Andrew W. Maholich and Richard B. Freeman, "A Universal Cyclic Division Circuit," in AFIPS Conference Proceedings of the 1971 Fall Joint Computer Conference. Volume 39, AFIPS Press, Montvale, New Jersey.

Accordingly, it is an object of present invention to provide an apparatus for multiplying two arbitrary field elements in a Galois field.

It is another object of the present invention to provide a systematic combinational logic implementation for multiplying Galois field elements.

It is a further object of the present invention to provide an apparatus for multiplying two field elements modulo $g(x)$, where $g(x)$ is an $m$-degree maximum-exponent polynomial which defines the Galois field.

Other objects and inventions will become apparent when the specification is reviewed in combination with the drawings included herein.

Summary

The invention comprises circuitry for systematically multiplying two arbitrary field elements in a Galois field GF($2^m$). Each element is represented by an m-bit binary quantity. The multiplicand field element is passed serially through a plurality of $m-1$ modulo multipliers. The multiplicand and the product from each of the $m-1$ modulo multipliers are passed through networks which are gated by corresponding bits of the multiplier field element forming partial products. The partial products are summed by m XOR networks to form the $m$-bit quantity representing the final product.

DESCRIPTION OF THE PREFERRED EMBODIMENT

Prior to discussing the preferred embodiment in detail, it is believed that a brief discussion of Galois fields would be helpful. A generator polynomial $g(x)$ defines a Galois field GF($2^m$), where $g(x)$ is of degree $m$. GF($2^m$) can be represented by the field of polynomials over GF(2) modulo $g(x)$. Each field element is actually a residue class of polynomials such that any two polynomials in the same residue class are equivalent modulo $g(x)$. The residue class containing $x$ is denoted $z$. Therefore, the field element $z$ is a root of $g(x)$, i.e., $g(z)=0$. $g(x)$ is selected to be a maximum-exponent polynomial, making z a primitive element, i.e., z has order $n=2^m-1$. Therefore, the powers of z, $z^0$ through $z^n$ where $n=2^m-1$, represent the n distinct non zero elements in GF($2^m$). Table I shows a representation of GF($2^4$) for a maximum-exponent polynomial, $g(x)=x^4+x+1$.

Table I

| | | |
|---|---|---|
| $z^0 =$ | 1 | = 0001 |
| $z^1 =$ | z | = 0010 |
| $z^2 =$ | $z^2$ | = 0100 |
| $z^3 =$ | $z^3$ | = 1000 |
| $z^4 =$ | $z + 1$ | = 0011 |
| $z^5 =$ | $z^2 + z$ | = 0110 |
| $z^6 =$ | $z^3 + z^2$ | = 1100 |
| $z^7 =$ | $z^3 + z + 1$ | = 1011 |
| $z^8 =$ | $z^2 + 1$ | = 0101 |
| $z^9 =$ | $z^3 + z$ | = 1010 |
| $z^{10} =$ | $z^2 + z + 1$ | = 0111 |
| $z^{11} =$ | $z^3 + z^2 + z$ | = 1110 |
| $z^{12} =$ | $z^3 + z^2 + z + 1$ | = 1111 |
| $z^{13} =$ | $z^3 + z^2 + 1$ | = 1101 |
| $z^{14} =$ | $z^3 + 1$ | = 1001 |
| $z^{15} =$ | 1 | = $z^0$ |

It is noted that addition and multiplication of the field elements $z^0$ to $z^{14}$ result in sums and products which are, themselves, field elements. (It is noted that summing two bits is equivalent to performing an XOR function; multiplying two bits is equivalent to performing an AND function.) The multiplication of two field elements can be visualized as simple binary multiplication which may result in a product which is longer than m bits in length, and then taking that product modulo $g(x)$ to yield the final product which is a field element. In general, modulo $g(x)$ multiplication may be performed one of two ways. Complete binary multiplication may be done with the resultant product then reduced modulo $g(x)$ to yield the final product. Alternatively, each partial product generated in the simple binary multiplication process may be taken modulo $g(x)$. When these partial products are then added, the result will necessarily be a modulo $g(x)$ result and, therefore, a field element. The present invention embodies the second method.

Figure 1:
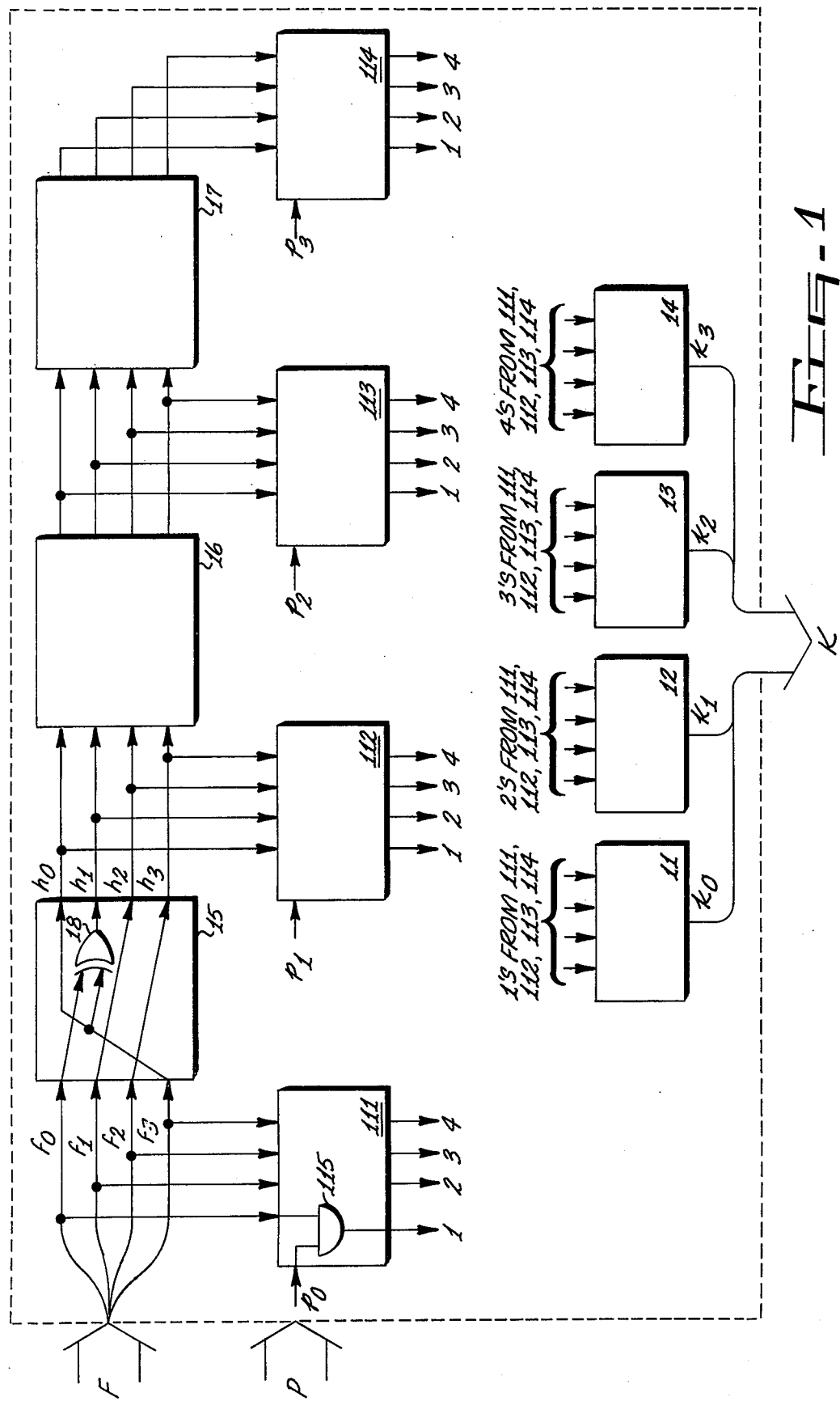
FIG. 1 is a block diagram of a 4-bit multiplier in GF($2^4$) according to the invention.

FIG. 1 shows a multiplier for two elements in GF($2^4$). This is special case of the general multiplier shown in FIG. 2 which multiplies two arbitrary elements in GF($2^m$). In FIG. 1 the multiplication is taken modulo $g(x)$, where $g(x) = x^4 + x + 1$.

The multiplier in FIG. 1 receives as input signals two elements GF($2^4$) which may be represented as 4-bit input signals F and P. The multiplicand F has bits $f_0, f_1, f_2, f_3$; $f_0$ being the least significant bit (LSB). The multiplier P has bits $p_0, p_1, p_2, p_3$; $p_0$ being the LSB. F and P may be considered polynomials $f(x)$ and $p(x)$. Blocks 15 to 17 are identical; they multiply their inputs by $x$ and produce a result modulo $g(x)$, which is necessarily also a 4-bit signal; hence, they are referred to as modulo multipliers. Blocks 15 to 17 may be easily implemented by a simple shifting and gating system. For example, the product $xf(x)$ may be represented as bits $h_0, h_1, h_2, h_3$; $h_0$ being the LSB. Block 15 shifts signals as follows: $f_1$ to $h_2$, $f_2$ to $h_3$, and $f_3$ to $h_0$, $f_0$ and $f_3$ through XOR gate 18 to obtain h. The four bits of $f(x)$ are fed into block 111. Block 111 gates each of these signals by $p_0$. Accordingly, block 111 may be comprised of 4 AND gates enabled by $p_0$. One of these gates 115 is shown in FIG. 1. Similarly, the 4 output signals from blocks 15, 16, 17 are sent to blocks 112, 113, 114 respectively and gated by signals $p_1$, $p_2$, $p_3$ respectively. The output signals from blocks 111 to 114 are the partial products modulo $g(x)$. The lines are labeled as 1, 2, 3, 4, but this designation is merely for convenience. All four signals designated 1, the LSBs, are sent to block 11. Similarly, signals designated 2, 3, 4 are sent to blocks 12, 13, 14 respectively. Blocks 11 to 14 perform an XOR function (which is sum over GF(2)) on their input signals, thereby providing output signals $k_0$ to $k_3$ respectively, $k_0$ being the LSB. In this manner $P \times F = K$.

Figure 2:
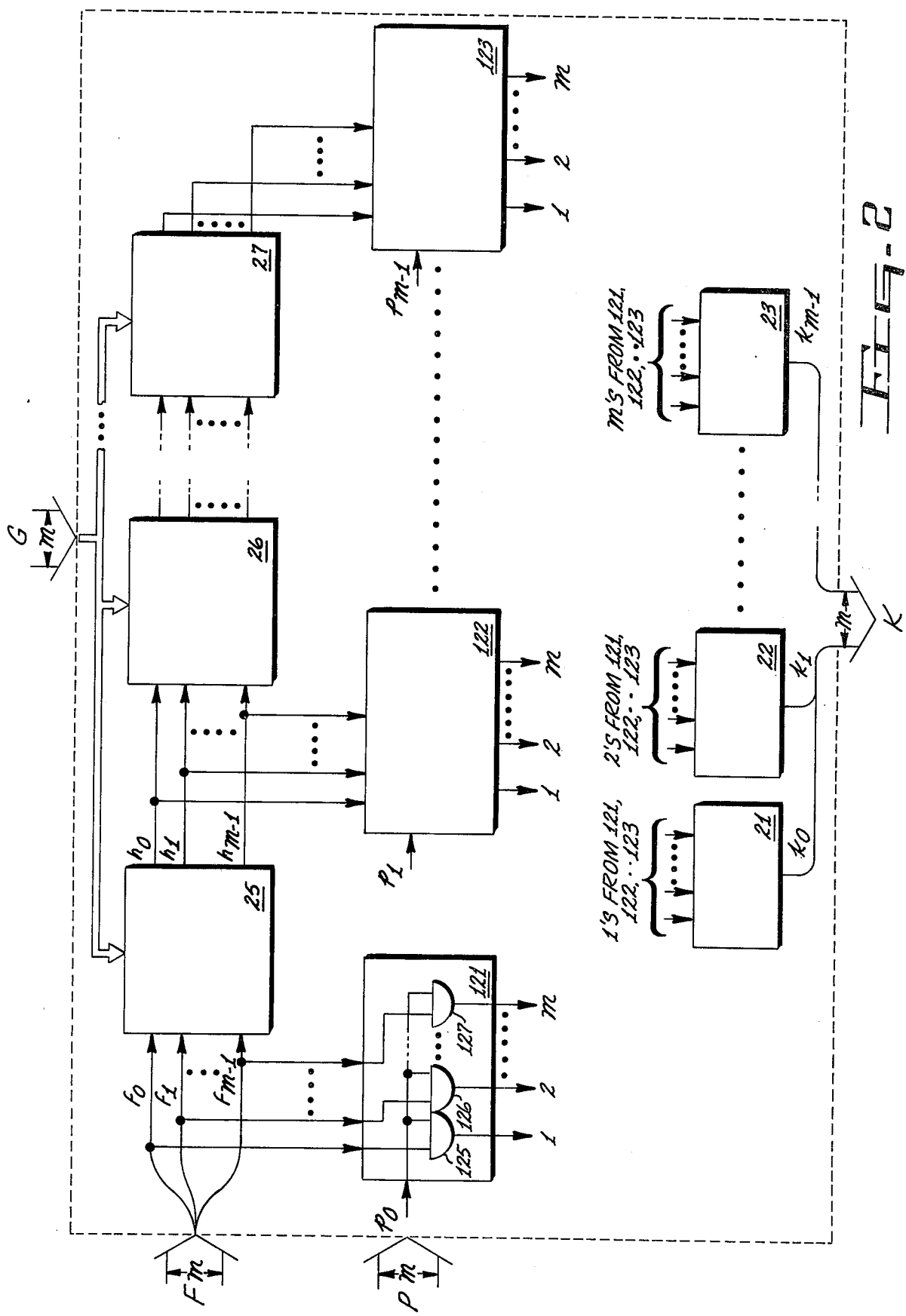
FIG. 2 is a block diagram of an $m$-bit multiplier in GF($2^m$) according to the invention.

Referring now to FIG. 2, the general case of the multiplier for two arbitrary elements in GR($2^m$) Is shown. In the general case, $g(x) = \rho g_i x^i$ where $i$ goes from 0 to $m$.

The multiplier receives as input signals two elements in GF($2^m$) which may be represented as $m$-bit input signals F and P. The multiplicand F has bits $f_0, f_1, \ldots f_{m-1}$; $f_0$ being the LSB. The multiplier P has bits $p_0, p_1, \ldots p_{m-1}$; $p_0$ being the LSB. F and P may be considered polynomials $f(x)$ and $p(x)$. Blocks 25 to 27 are identical; they multiply their inputs by $x$ and produce a result modulo $g(x)$, which is necessarily also an $m$-bit signal. Hence, they are sometimes referred to as modulo multipliers. The $m$ bits of $f(x)$ are fed into block 121. Block 121 gates each of these signals by $p_0$. Accordingly, block 111 may be comprised of $m$ AND gates each enabled by $p_0$. These gates 125, 126, ... 127 are shown in FIG. 2. Similarly, the output signals from blocks 25, 26, 27 are sent to blocks 122, ... 123 respectively and gated by signals $p_1$, $p_2$, ... $p_{m-1}$ respectively. The output signals from blocks 121 to 123 are the partial products modulo $g(x)$. The lines are labeled as 1, 2, ... $m$, but this designation is merely for convenience. All four signals designated 1, the LSBs, are sent to block 11. Similarly, signals designated 2, ... $m$ are sent to blocks 22 ... 23, respectively. Blocks 21 to 23 perform an XOR function on their input signals, thereby providing output signals $k_0$ to $k_{m-1}$ respectively, $k_0$ being the LSB. In this manner $F \times P = K$.

FIG. 2 is identical to FIG. 1 with the following exceptions. Whereas in FIG. 1 there are three blocks for modulo multiplication and four blocks each for partial products and final summing, FIG. 2 contains $m-1$ blocks for modulo multiplication and $m$ blocks each for partial products and final summing. For the case of $m=4$, FIG. 2 reduces to FIG. 1. Also, modulo multiplier blocks 25 to 27 are more general in FIG. 2. They are shown in additional detail in FIG. 3.

Figure 3:
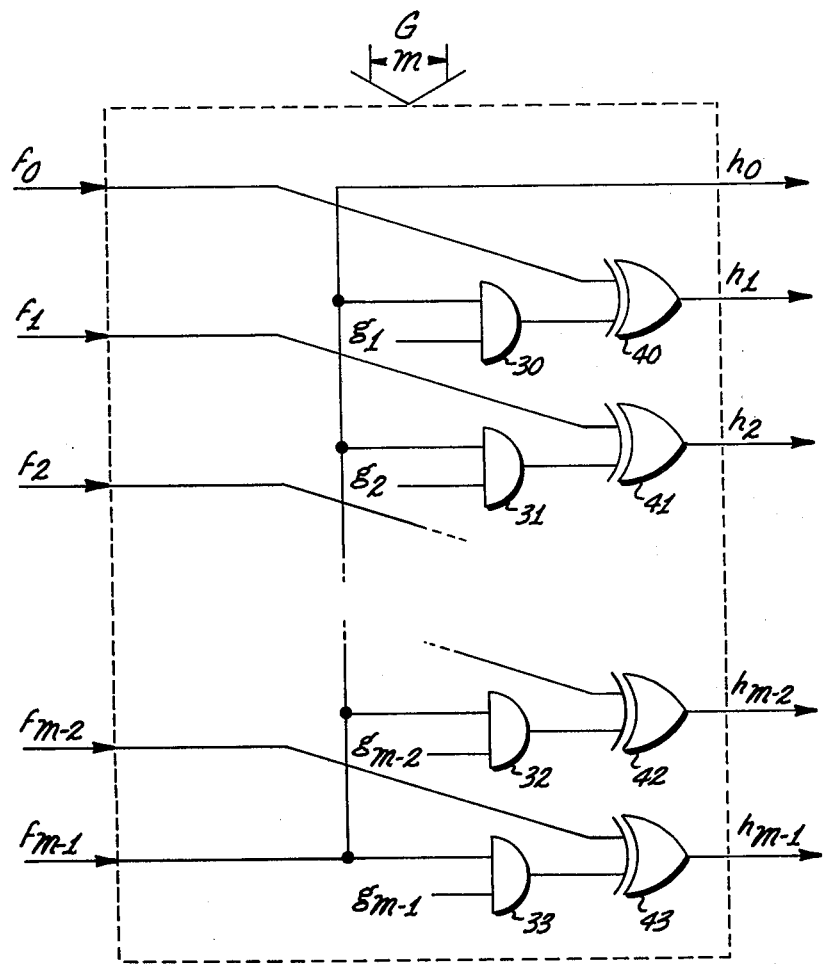
FIG. 3 is a logic diagram showing the modulo multiplier component of FIG. 2 in greater detail.

Referring now to FIG. 3, a generalized embodiment of the modulo multiplier is shown. The modulo multiplier is a gating and shifting network. Input F is represented as signals $f_0$ to $f_{m-1}$, output H of signals $h_0$ to $h_{m-1}$. Output H is derived as follows: $h_0 = f_{m-1}$. $h_1$ to $h_{m-1}$ are the output signals from XOR gates 40 to 43 respectively. XOR gates 40 to 43 receive as one of their input signals $f_0$ to $f_{m-2}$ respectively. The other input signal to each gate 40 to 43 is the output of one of gates 30 to 33 respectively. Each of gates 30 to 33 receive as one of its input signals $f_{m-}$. The other input signal, which may be considered as an enabling signal, is $g_1$ to $g_{m-1}$ respectively.

The relationship between the modulo multiplier and the generator polynomial may now be explored. $f_{m-1}$ is always shifted to become $h_0$ since $g_0$ (the LSB of $g(x)$) is always a one. (This is necessary; otherwise $g(x)$ would be reducible and, therefore, would not be a primitive polynomial). The rest of the shifting is from $f_i$ to $h_{i+1}$. However, $f_i$ is XORed with $f_{m-1}$ if $g_{i+1} = 1$, where $i = 1$ to $m - 1$. Since $g_i$ are given, $f_{m-1}$ can be hardwired to the appropriate XOR gates. In FIG. 1, only $g_1$ is present and, therefore, the only XORing operation performed is on $f_0$ and $f_1$ to obtain $h_1$.

An embodiment of the present invention has been described in detail. It will be recognized by those skilled in the art that it comprises a systematic approach to the problem of matrix multiplication in GF($2^m$). For example, the present invention can also be used to multiply an ordered m×m matrix [Q] by an element P in GR($2^m$), where [Q] consists of $m$ consecutive powers of $z$ (consecutive elements in GF($2^m$)) as its $m$ rows, i.e., $$[Q] = \begin{bmatrix} z^i \\ z^{i+1} \\ \cdot \\ \cdot \\ z^{i+m-1} \end{bmatrix}$$

for $0 \leq i \leq 2^m - 2$. If the first row of [Q], $Z^i$, is a field element denoted F, and if the field element P is also considered an m-bit row vector [P], then F and P inputs to the multiplier of the present invention produces $K = PF = [P][Q]$. Those skilled in the art will also recognize that the present invention may be otherwise embodied without departing from the spirit and scope of the present invention.

What is claimed is:

1. An apparatus for multiplying arbitrary field elements F(x) and P(x) (where $F(x) = f_i x^i$, $P(x) = P_i x^i$ for $i$ from 0 to $m-1$) in a Galois field GF($2^m$), where $g(x)-g_ix^i$ ($i=0$ to $m$) is a generator polynomial for said Galois field, comprising:

$m-1$ ordered multiplying means, the first of said ordered multiplying means responsive to signals representing field elements of $F(x)$, the remainder of said ordered multiplying means responsive to output signals from the preceding one of said ordered multiplying means, each of said multiplying means multiplying its output by $x$ and producing a result modulo $g(x)$;

$m$ ordered logical means, the ith of said logical means coupled to the $(i-1)$ of said multiplying means and having input signals $x^iF(x)$, ith logical means gating its input by $p_i$ and producing a partial product of $PxG$; and PxF from $m$ summing means responsive to said m logical means for receiving said partial products, said summing means generating signals corresponding to the product $P+F$ modulo $g(x)$, each member of said summing means responsive to a corresponding component of a partial product of each of said logical means.

2. The apparatus as defined in claim 1 wherein each of said ith logical means comprises a plurality of $m$ logic gates enabled by $p_i$, the jth said logic gates responsive to the jth bit of $x^iF(x)$.

3. The apparatus as defined in claim 1 wherein said summing means comprises m summing circuits, the ith of said summing circuits receiving the ith bit of each of said partial products and generating a signal corresponding to said ith bit of said product PxF modulo $g(x)$.

4. The apparatus as defined in claim 1 wherein each of said plurality of multiplying means comprises a switching and gating circuit, wherein when the inputs to said circuit are $J(x)=j_ix^i$ and the output of said circuit are $H(x)=h_ix^i$, said circuit switches and gates its inputs to produce outputs with the following relationships:

$h_0=j_{m-1}$.

$h_i=j_{i-1}+(j_{m-1}g_i,)$ where $i=1$ to $m-1$.

5. The apparatus as defined in claim 4 wherein each of said circuits comprises:

$m-1$ ordered AND gates responsive to $g_1$ to $g_{m-1}$ respectively, all of said AND gates responsive to $j_{m-1}$, and $m-1$ ordered XOR gates, the ith of said XOR gates responsive to the ith of said AND gats and to $j_{i-1}$ for generating a signal corresponding to $h_i$.

* * * * *